United States Patent [19]

Roberts

[11] Patent Number: 4,722,882
[45] Date of Patent: Feb. 2, 1988

[54] METHOD OF MANUFACTURING A SEMICONDUCTOR DEVICE

[75] Inventor: Edward D. Roberts, Purley, United Kingdom

[73] Assignee: U.S. Philips Corporation, New York, N.Y.

[21] Appl. No.: 816,605

[22] Filed: Jan. 6, 1986

[30] Foreign Application Priority Data

Jan. 11, 1985 [GB] United Kingdom ............... 8500681

[51] Int. Cl.$^4$ ............................................... G03C 5/00
[52] U.S. Cl. .................................. 430/313; 430/317; 430/326
[58] Field of Search ............... 430/313, 326, 328, 331, 430/311, 317

[56] References Cited

U.S. PATENT DOCUMENTS

| | | | |
|---|---|---|---|
| 3,652,274 | 3/1972 | Verelst et al. | |
| 4,125,650 | 11/1978 | Chiu et al. | 427/337 |
| 4,552,833 | 11/1985 | Ito et al. | 430/325 |
| 4,613,398 | 9/1986 | Chiong et al. | 156/628 |

Primary Examiner—John E. Kettle
Assistant Examiner—José G. Dees
Attorney, Agent, or Firm—Norman N. Spain

[57] ABSTRACT

A method of manufacturing a semiconductor device, in which method a pattern is etched by a dry etching process, for example, in a substrate protected by a resist pattern which is the negative of the pattern to be etched. In order to obtain a resist pattern which has adequate resistance to dry etching and which has been produced from a resist film having a high sensitivity, the resist pattern is produced in two stages. First a pattern is formed in a resist film present on a substrate, which resist film has been formed from a polymer made by polymerizing a monomer of the structure

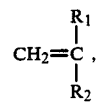

wherein $R_1$ is an alkyl group, Cl, Br, CN, H or $R_2$, $R_2$ is —COCl, —COBr, —COOH or —CONH$_2$, and $R_1$ does not react with $R_2$. Then the material of the resist pattern is reacted with a mono- or poly-functional organic compound, with an organic siloxane containing SiH groups or other Si-containing functional groups which react with the resist pattern material, or with a metallo-organic compound. The functional group(s) of the mono- or poly-functional compound reacts with the group $R_2$ of the resist pattern material so as to introduce an aromatic group or other dry-etch resistant group or atom into the resist pattern material.

4 Claims, No Drawings

METHOD OF MANUFACTURING A SEMICONDUCTOR DEVICE

BACKGROUND OF THE INVENTION

The invention relates to a method of manufacturing a semiconductor device, in which method a pattern is etched by a dry etching process, for example, a plasma etching process, in a substrate protected by a resist pattern which is the negative of the pattern to be etched.

As integrated circuit technology has developed, there has been a progressive increase in the density of the circuitry per unit area and the circuit geometry detail has become progressively finer, so that in some cases line-widths of less than 1 μm are now required. Both in order to produce such fine geometries satisfactorily and also to avoid problems which are caused by residues of reagents and reaction products remaining on semiconductor structures which have been processed by wet chemical etching, dry etching methods are being used on a growing scale for etching semiconductor structures.

When dry etching methods have been used in the manufacture of semiconductor devices and positive-working resists having high sensitivities have been used to define the patterns to be etched, it has been found that the resist patterns were very rapidly eroded and therefore could not adequately protect the underlying semiconductor structures. This was not unexpected, because a positive-working resist is formulated so that it should degrade readily when exposed to ionising radiation, so that it would not be expected that a positive-working resist material would withstand degradation when placed in a plasma which is an environment which contains electrons and other charged species. Since some negative-working resists have a greater resistance to erosion by dry etching than positive-working resists, there is less need to increase the resistance to erosion by dry etching for negativ-working resits than there is to take this step for positive-working resists.

U.K. Patent Specification GB No. 2,121,197A describes a method of forming on a substrate a mask resistant to plasma etching, including the step of lithographically patterning a film of radiation-sensitive resist present on said substrate characterised by the further steps of providing a coating layer of material on the patterned resist film and on exposed areas of the substrate, effecting a heat treatment such that the material of said layer reacts chemically with the resist to form a plasma etch-resistant skin at the surface of the patterned resist film, and removing the unreacted material of the coating layer to leave the patterned resist film with the skin as the mask on the substrate. There is no mention in the GB No. 2,121,197A specification of any value of the sensitivity of the resist, and the sensitivity of a resist formed from a mixture of poly-(methyl methacrylate-co-methacrylic acid) and poly-(methyl methacrylate-co-methacryloyl chloride) when irradiated with 20 kV electrons is at least 10 μC/cm². When a charge density of only 10 μC/cm² is used to form a pattern in this resist, there is such a large reduction in thickness of the unirradiated areas of the resist film during development that the definition of the resist pattern is significantly impaired.

SUMMARY OF THE INVENTION

An object of the invention is to provide a method of manufacturing a semiconductor device, in which method a pattern is etched in a substrate by dry etching using a resist pattern which is resistant to attack by dry etching, and which resist pattern has been formed from a high sensitivity resist film.

The invention provides a method of manufacturing a semiconductor device, the method comprising the steps of forming a resist film on a semiconductor substrate, lithographically processing the resist film so as to produce a desired resist pattern, reacting the material of the resist pattern with a mono- or poly-functional organic compound, with an organic siloxane containing SiH groups or orther functional groups which react with the resist pattern material, or with a metallo-organic compound so as to increase the resistance of the resist pattern material to dry etching, and dry etching the areas of the semiconductor substrate which are exposed through the apertures in the treated resist pattern, wherein the resist film is formed from a polymer made by polymerising a monomer of the structure

Wherein $R_1$ is an alkyl group, Cl, Br, CN, H or $R_2$, $R_2$ is —COCl, —COBr, COOH or $CONH_2$, and wherein $R^1$ does not react with $R_2$, and wherein the functional group(s) of the mono- or poly-functional organic compound, organic siloxane, or metallo-organic compound react(s) with the group $R_2$ of the resist pattern material so as to introduce an aromatic group or other dry-etching resistant group or atom into the material. Since $R_1$ does not react with $R_2$, the resist film polymer is a straight-chain polymer and is not cross-linked.

When using positive-working resists, the conflicting requirements of producing a resist pattern which has a good sensitivety, and which pattern is resistant to erosion by dry etching processes can be reconciled by treating the two stages of the process independently. In this case the resist pattern is formed using a resist which has been formulated to have a desired sensitivety to the pattern-defining irradiation, irrespective of the ability of the resist material to withstand the action of dry etching, and also to contain chemically reactive groups which in themselves may or may not have any effect upon the radiation-sensitivety of the resist. Then the resist pattern is reached with the mono- or poly-functional compound so as to introduce an aromatic group or some other dry-etch resistant group or atom into the pattern material.

DESCRIPTION OF THE PREFERRED EMBODIMENTS

When the resist pattern material is reacted with a solution of the mono- or poly-functional compound, it is preferred that the pattern material should have a solubility of less than 1% w/w in the solvent of the solution at the treatment temperature.

The mono- or poly-functional organic compound, for example, may have a composition defined by one of the following formulae:

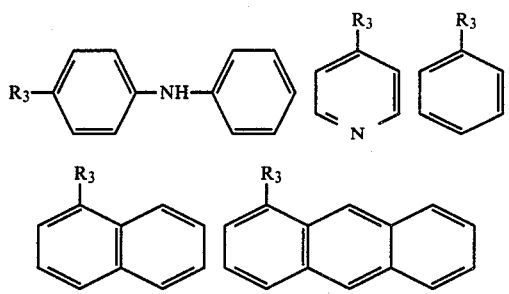

or a derivative of such a formula containing a substituent at another position in the ring, wherein $R_3$ is $NH_2$, OH, $CH_2NH_2$ or $CH_2OH$.

It was found possible when using the method according to the present invention to produce resist patterns from poly-methacryoyl chloride resist films having a sensitivity, for example, of 1 to 10 $\mu C/cm^2$. When using a charge density of 1.8 $\mu C/cm^2$, as a result of the development process needed to develop the irradiated areas of the resist film, there was a 30% reduction of the thickness of the unirradiated areas of the resist film. When a charge density of 7 $\mu C/cm^2$ was used, this reduction of thickness was 10%.

In another embodiment of the invention, the monomer from which the resist is formed is methacryloyl chloride ($R_1=CH_3$ and $R_2=COCl$). It has been found that aniline is a very suitable mono-functional organic compound for enhancing the dry-etch resistance of polymethacryloyl chloride resists. It is generally preferable to use mono-functional organic compounds for the radiation with the resist pattern material as this generally appears to allow more etch-protecting groups to be introduced into the pattern material than can be introduced by using polyfunctional compounds. Organic siloxanes or metallo-organic compounds may be more suitable when the resist pattern is to be subjected to an etching process which erodes a purely organic resist pattern material at an unacceptable rate.

Examples of monofunctional compounds which may be used in a method according to the invention are aniline, phenol, triphenylsilanol, 3-amino-propyltriethoxysilane, 4-amino-3-hydroxynaphthalene-1-sulphonic acid, 8-amino-naphthalene-2-sulphonic acid, 3-aminopyridine, 4-nitroaniline and 1-aminoanthraquinone. Examples of poly-functional compounds which may be used in a method according to the invention are aluminium isopropoxide, m-aminophenol, p-phenylenediamine, 4-aminodiphenylamine, poly-methylsiloxane (Dow Corning 1107), melamine and p-aminophenol.

The resist film may be formed, for example, on a chromium film on a transparent plate, and areas of the chromium film which are exposed through apertures in the resist pattern are dry etched so as to from a mask which is used in the manufacture of the semiconductor device. In another embodiment of the invention, the substrate on which the resist film is formed is a semiconductor substrate. It is preferred to treat the resist pattern with a solution of the mono- or poly-functional organic compound, organic siloxane or metallo-organic compound, since the most reproducible results are then achieved.

Although the present specification particularly describes lithographic processing of a resist film when using electron irradiation to define the pattern, it will be evident to those skilled in the art that in the method according to the invention, the pattern in the resist film may be defined by means of irradiation other than electrons, for example, ion beams, X-rays or deep UV.

Some embodiments of the invention will now be described with reference to Examples 1 to 28. Examples A, B and C are outside the scope of the invention and are included for comparative purposes.

EXAMPLES 1 TO 3

Four 60 mm diameter fused silica discs were each provided with a 1000 Å thick chromium film on one main surface, and a 0.16 $\mu$m thick film of poly-methacryloyl chloride (having a molecular weight of 145,000) was formed on each chromium film by spinning a 10% w/w solution of the poly-methacryloyl chloride in chlorobenzene at 6000 r.p.m. and baking the coated slices at 160° C. for half an hour in air. A pattern was formed in each resist film by exposing the films patternwise to 20 kV electrons using a charge density of 5 $\mu C/cm^2$, and developing the irradiated films in methyl isobutyl ketone for 75 seconds at 23° C. During the development process, the thickness of the unirradiated areas of the films decreased by approximately 20%. The exposed areas of the chromium films were then descummed by plasma etching in an oxygen (133 Pa) plasma for 30 seconds using a power of 100 watts and a substrate temperature of 30° C.

Three of the discs were then immersed one each in aniline solutions of the compositions specified in Table 1 for the times and at the temperatures specified in that table. After immersion in the respective solution, the treated disc was rinsed in the pure solvent, was then blown dry, was rinsed in water in order to remove any aniline hydrochloride crystals present, and was then blown dry.

Masks were formed by subjecting each of the discs to a standard carbon tetrachloride based chromium dry etching process for 20 minutes using an atmosphere at a pressure of 67 Pa consisting of a mixture of 4 volumes of carbon tetrachloride vapour and one volume of oxygen, a power of 400 watts and a substrate temperature of 30° C., which etched through the exposed areas of the chromium films. The third column of Table 1 specifies the relative erosion rates of each of the polymethacryloyl chloride films which had been treated in an aniline solution and are expressed as a percentage of the erosion rate of the untreated polymethacryloyl chloride film. The treated resist films were etched at approximately half the rate at which chromium was etched in this process. The patterned treated resist film may be removed from the patterned chromium layer on the fused silica disc, for example, by means of fuming nitric acid. The finest details produced in these chromium masks were 0.3 $\mu$m wide.

| Example no. | Treatment Conditions | Relative erosion rate (%) |
|---|---|---|
| 1 | 1% w/w aniline in xylene ¾ h 60° C. | 31 |
| 2 | 4% w/w aniline in ligroin 1 h 60° C. | 37 |
| 3 | 4% w/w aniline in ligroin 18 h 65° C. | 31 |

No chromium film is used in any of Examples 4 to 28; these Examples illustrate the reduction of the erosion rate of poly-methacryloyl chloride films etched in the above-mentioned chromium dry etching process after these films have been treated in different ways with various mono- or poly-functional compounds.

EXAMPLES 4 TO 7

Five 38 mm diameter silicon slices were each provided with a 1.16 μm thick film of poly-methacryloyl chloride (having a molecular weight of 86,000) by spinning a 20% w/w solution in a mixture of equal volumes of xylene and methyl isobutyl ketone at 6000 r.p.m., and baking the coated slices in air at 150° C. for 1 hour. Two of the coated slices were then exposed to the action of aluminum isopropoxide vapour at 130° C. for 1 hour and 3 hours respectively. The slices were suspended in separate pots with some solid aluminium isopropoxide, and the pots were then evacuated and seald. The pots were placed in an oven at 130° C. for the appropriate time, and were then cooled. The aluminium asopropoxide was removed from the pot, and the pot containing the coated slice was heated at 130° C. for 1 hour under continuous vacuum. After cooling, the coated slices were weighed, and were then subjected to the abovementioned standard CCl4-based chromium dry etching process for 20 minutes. Two coated slices were treated in a similar manner in m-aminophenol at 130° C.

Table 2 below gives the erosion rates in Å/min. in the third column and the relative erosion rates expressed as percent of the erosion rate of the untreated poly-methacryloyl chloride film (Example A) in the third column.

TABLE 2

| Example No. | Treatment conditions | Relative erosion rate (%) |
|---|---|---|
| A | None | 100 |
| 4 | Aluminum isopropoxide 130° C. 1 hour | 24 |
| 5 | Aluminum isopropoxide 130° C. 3 hours | 10 |
| 6 | m-aminophenol 130° C. 1 hour | 62 |
| 7 | m-aminophenol 130° C. 2 hours | 40 |

EXAMPLES 8 TO 12

Three 38 mm diameter silicon slices were each provided with a 0.4 μm thick film of poly-methacryloyl chloride (having a molecular weight of 145,000) by spinning a 15% w/w solution in chlorobenzene at 6000 r.p.m., and baking the coated slices in air at 160° C. for ½ hour. Two of the coated slices were then exposed to the action of aniline vapour at 25° C. for 1½ hours and 64 hours respectively by suspending the slices in closed pots containing aniline. At the end of the treatment, the aniline was removed from the pot and the residual unreacted aniline present in the coating was removed by rinsing the coated the slice in xylene and then blowing it dry.

Four 38 mm diameter silicon slices were coated in a similar manner using poly-methacryloyl chloride having a molecular weight of 207,000. Three of the coated slices were exposed to aniline vapour at 40° C. for 20 minutes, 40 minutes and 1½ hours respectively.

Each of the above slices was etched in the above-mentioned standard CCl4-based chromium dry etching process for 20 minutes, and the results are summarised in Table 3.

TABLE 3

| Example No. | M.W. of coating | Treatment conditions | Relative erosion rate (%) |
|---|---|---|---|
| B | 145,000 | None | 100 |
| 8 | 145,000 | Aniline vapour 25° C., 1½ hours | 87 |
| 9 | 145,000 | Aniline vapour 25° C., 64 hours | 23 |
| C | 207,000 | None | 100 |
| 10 | 207,000 | Aniline vapour 40° C., 20 mins | 48 |
| 11 | 207,000 | Aniline vapour 40° C. 40 mins | 36 |
| 12 | 207,000 | Aniline vapour 40° C. 90 mins | 32 |

EXAMPLES 13 TO 22

Ten 38 mm diameter silicon slices were each provided with a 0.4 μm thick layer of poly-methacryloyl chloride (molecular weight of 145,000) using a 15% w/w solution of the polymer in chlorobenzene, by spinning the coated slices at 6000 r.p.m. and baking the coated slices in air for 0.5 hours at 160° C. The baked slices were immersed one in each of the following solutions for 1½ hours at 60° C. After immersion, the slices were drained, rinsed in the solvent used to make the repective solution and blown dry. Each of the coated slices were then etched for 20 minutes in the above-mentioned standard CCl4-based chromium dry etching process. The results are summarised in Table 4.

TABLE 4

| Example No. | Solution composition | Relative erosion rate (%) |
|---|---|---|
| 13 | 5% w/w aniline in xylene | 8.5 |
| 14 | 5% w/w polymethylsiloxane in xylene | 68 |
| 15 | Saturated at 25° C. 4-aminodiphenylamine in xylene | 42 |
| 16 | Saturated at 25° C. 1-aminoanthraquinone in xylene | 62 |
| 17 | 20% w/w aluminium isopropoxide in xylene | 62 |
| 18 | Saturated at 25° C. melamine in water | 76 |
| 19 | 1% w/w 3-aminopyridine in water | 80 |
| 20 | Saturated at 25° C. p-phenylenediamine in water | 79 |
| 21 | 5% w/w phenol in xylene | 83 |
| 22 | 5% w/w phenol + 0.5% w/w pyridine in water | 66 |

EXAMPLES 23 TO 28

38 mm diameter silicon slices were coated with poly-methacryloyl chloride having a molecular weight of 207,000 by a method similar to that described in Examples 13 to 22 above. Coated slices were immersed in solutions having the compositions specified in Table 5, for the times and at the temperatures specified. The treatment after immersion and the dry etching procedure used were similar to those described in Examples 13 to 22.

TABLE 5

| Example | Solution composition | Immersion time | temp (°C.) | Relative erosion rate (%) |
|---|---|---|---|---|
| 23 | 5% w/w aniline in xylene | 64 hrs | 25 | 43 |
| 24 | 5% w/w aniline in xylene | 1½ hrs | 60 | 19 |
| 25 | 5% w/w aniline in xylene | 4 hrs | 60 | 30 |
| 26 | 8-aminonaphthalene-2-sulphonic acid in water | 1½ hrs | 60 | 63 |
| 27 | 3-aminopyridine in xylene | 1½ hrs | 60 | 41 |
| 28 | triphenysilanol in xylene | 1½ hrs | 60 | 78 |

What is claimed is:

1. A method of manufacturing a semiconductor device, said method comprising the steps of forming a positive-working resist film on a semiconductor substrate, lithographically processing said resist film so as to produce a desired resist pattern, reacting the material of said resist pattern with a compound containing a group reactive with the material of said resist pattern and selected from the group consisting of an aromatic compound defined by one of the following formulae:

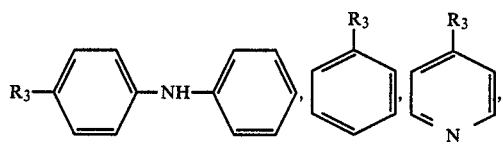

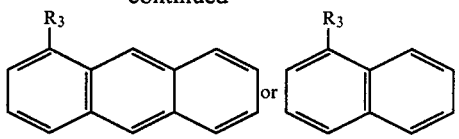

wherein $R_3$ is $NH_2$, OH, $CH_2NH_2$ or $CH_2OH$ or a ring substituted derivative of such a compound, organic siloxanes containing SiH groups and metallo-organic compounds so as to increase the resistance of the resist pattern to dry etching, and dry etching the areas of said substrate exposed through apertures in said treated resist pattern, said resist film being formed of a polymer made by polymerizing a monomer of the formula

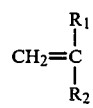

wherein $R_1$ is an alkyl group, Cl, Br, CN, H or $R_2$, $R_2$ is —COCl, —COBr, —COOH or —CONH$_2$ and wherein $R_1$ does not react with $R_2$ and wherein the functional group of the compound reactive with the material of the resist pattern reacts with the group $R_2$.

2. A method as claimed in claim 1, wherein $R_1$ is $CH_3$ and $R_2$ is COCl.

3. A method as claimed in claim 2, wherein the resist pattern is reacted with aniline.

4. A method of claim 1 wherein the resist pattern is reacted with a compound containing a group reactive with the material of said resist pattern by immersion in a solution of said compound.

* * * * *